United States Patent
Shang

(10) Patent No.: US 12,237,038 B2
(45) Date of Patent: Feb. 25, 2025

(54) LOCAL SENSING AMPLIFIER AND MEMORY

(71) Applicant: CHANGXIN MEMORY TECHNOLOGIES, INC., Hefei (CN)

(72) Inventor: Weibing Shang, Hefei (CN)

(73) Assignee: CHANGXIN MEMORY TECHNOLOGIES, INC., Hefei (CN)

(*) Notice: Subject to any disclaimer, the term of this patent is extended or adjusted under 35 U.S.C. 154(b) by 260 days.

(21) Appl. No.: 17/867,687

(22) Filed: Jul. 19, 2022

(65) Prior Publication Data

US 2023/0274770 A1 Aug. 31, 2023

Related U.S. Application Data

(63) Continuation of application No. PCT/CN2022/097964, filed on Jun. 9, 2022.

(30) Foreign Application Priority Data

Feb. 25, 2022 (CN) .......................... 202210179341.4

(51) Int. Cl.
*G11C 7/06* (2006.01)
*G11C 7/22* (2006.01)

(52) U.S. Cl.
CPC . *G11C 7/06* (2013.01); *G11C 7/22* (2013.01)

(58) Field of Classification Search
CPC ..................................... G11C 7/06; G11C 7/22
USPC ........................................................ 365/203
See application file for complete search history.

(56) References Cited

U.S. PATENT DOCUMENTS

| 6,141,275 A * | 10/2000 | Tsai ..................... G11C 7/1048 365/189.09 |
| 2006/0104119 A1 | 5/2006 | Ha et al. |
| 2006/0233038 A1 | 10/2006 | Kang et al. |
| 2019/0214057 A1* | 7/2019 | Won ....................... G11C 5/025 |

FOREIGN PATENT DOCUMENTS

| CN | 101083133 A | 12/2007 |
| CN | 101496110 A | 7/2009 |
| CN | 102347067 A | 2/2012 |
| CN | 102956262 A | 3/2013 |
| CN | 109754830 A | 5/2019 |
| CN | 112786089 A | 5/2021 |
| CN | 113395465 A | 9/2021 |
| CN | 113760174 A | 12/2021 |

* cited by examiner

*Primary Examiner* — Huan Hoang
(74) *Attorney, Agent, or Firm* — Kilpatrick Townsend & Stockton LLP

(57) ABSTRACT

A local sensing amplifier and a memory are provided. The local sensing amplifier is connected to a global signal line and is connected to a sense amplifier array by means of a local signal line and a complementary local signal line. The local sensing amplifier transmits a signal on the local signal line to the global signal line when a read control signal is received, and to transmit a signal on the global signal line to the local signal line when a write control signal is received. The local sensing amplifier includes a precharge circuit connected to a preset voltage source, the local signal line and the complementary local signal line. The preset voltage source provides a first voltage in a read-write interval and provide a second voltage in an idle period. The precharge circuit transmits first voltage to the local signal line and the complementary local signal line.

20 Claims, 6 Drawing Sheets

LOCAL SENSING AMPLIFIER AND MEMORY

CROSS-REFERENCE TO RELATED APPLICATION

The present disclosure is a continuation of PCT/CN2022/097964, filed on Jun. 9, 20222, which claims priority to Chinese Patent Application No. 202210179341.4, titled "LOCAL SENSING AMPLIFIER AND MEMORY" and filed on Feb. 25, 2022, the entire contents of which are incorporated herein by reference.

TECHNICAL FIELD

The present disclosure relates to the field of integrated circuit technology, and more particularly, to a local sensing amplifier and a memory using the local sensing amplifier.

BACKGROUND

A local sensing amplifier (LSA) is an auxiliary circuit configured to implement data exchange between a global signal line and a local signal line in a memory and a sense amplifier (SA)/storage array.

FIG. 1 is a schematic diagram of a local sensing amplifier in related technologies. As shown in FIG. 1, the local sensing amplifier (hereinafter referred to as an LSA circuit) may be divided into two parts: LSA_1 and LSA_2, where the LSA_1 is distributed in a middle of the SA array (LSA_1X4), and the LSA_2 is distributed in a Sub Wordline Control (SWC) region (LSA_2X8). The LSA_1 is configured to perform data exchange, and the LSA_2 is configured to set different voltages for a local signal line Ldata and a complementary local signal line Ldata # connected to the LSA_1 in different operating states. Therefore, the LSA_2 includes two voltage transmission circuits controlled by two control signals (corresponding to different operating states) respectively.

In a memory chip, the LSA circuit as a whole needs to occupy a larger layout area. For example, in LPDDR5, one Section (storage section) requires 8 sets of LSA circuits (each set includes LSA_1+LSA_2). How to arrange these devices and ensure sufficient component sizes to meet design performance requirements is a great challenge as process dimensions are getting smaller and smaller.

It is to be noted that the information disclosed in the above background art section is only for enhancement of understanding of the background of the present disclosure, and therefore may include information that does not constitute the prior art that is already known to a person of ordinary skill in the art.

SUMMARY

An objective of the present disclosure is to provide a local sensing amplifier (LSA) and a memory using the LSA, to overcome at least to a certain extent a problem that the LSA circuit occupies a larger layout area due to limitations and defects of the related technologies.

According to a first aspect of the present disclosure, a local sensing amplifier is provided. The local sensing amplifier is connected to a global signal line and is connected to a sense amplifier array by means of a local signal line and a complementary local signal line. The local sensing amplifier is configured to transmit a signal on the local signal line to the global signal line when a read control signal is received, and to transmit a signal on the global signal line to the local signal line when a write control signal is received. The local sensing amplifier includes: a precharge circuit connected to a preset voltage source, the local signal line and the complementary local signal line. The preset voltage source is configured to provide a first voltage in a read-write interval and provide a second voltage in an idle period. The precharge circuit is configured to transmit the first voltage to the local signal line and the complementary local signal line in the read-write interval, and to transmit the second voltage to the local signal line and the complementary local signal line in the idle period, where the second voltage is smaller than the first voltage.

In an exemplary embodiment of the present disclosure, the precharge circuit includes: a first transistor, the first terminal of the first transistor being connected to the preset voltage source, a second terminal of the first transistor being connected to the local signal line, and a control terminal of the first transistor being connected to a precharge signal line; a second transistor, a first terminal of the second transistor being connected to the preset voltage source, a second terminal of the second transistor being connected to the complementary local signal line, and a control terminal of the second transistor being connected to the precharge signal line; and a third transistor, a first terminal of the third transistor being connected to the local signal line, a second terminal of the third transistor being connected to the complementary local signal line, and a control terminal of the third transistor being connected to the precharge signal line.

In an exemplary embodiment of the present disclosure, the first transistor, the second transistor and the third transistor are all N-type transistors.

In an exemplary embodiment of the present disclosure, the local sensing amplifier is further connected to a complementary global signal line, a read control signal line and a write control signal line, where the read control signal line is configured to transmit the read control signal, and the write control signal line is configured to transmit the write control signal. The local sensing amplifier further includes a first read-write control circuit and a second read-write control circuit. The first read-write control circuit is connected to the local signal line, the complementary local signal line, the global signal line, the read control signal line and the write control signal line. The first read-write control circuit is configured to transmit the signal on the global signal line to the local signal line when the write control signal is in an enabled state, and output a second signal to the global signal line when the read control signal is in the enabled state and the complementary local signal line transmits a first signal, where the second signal is inverse in phase to the first signal. The second read-write control circuit is connected to the local signal line, the complementary local signal line, the complementary global signal line, the read control signal line and the write control signal line. The second read-write control circuit is configured to transmit a signal on the complementary global signal line to the complementary local signal line when the write control signal is in an enabled state, and output the second signal to the complementary global signal line when the read control signal is in the enabled state and the local signal line transmits the first signal.

In an exemplary embodiment of the present disclosure, the first read-write control circuit includes: a fourth transistor, a first terminal of the fourth transistor being connected to the local signal line, a second terminal of the fourth transistor being connected to the global signal line, and a control terminal of the fourth transistor being connected to the write control signal line; a fifth transistor, a first terminal of the fifth transistor being connected to the global signal line, and a control terminal of the fifth transistor being connected to the complementary local signal line; a sixth transistor, a first terminal of the sixth transistor being connected to a second terminal of the fifth transistor, a second terminal of the sixth transistor being configured to receive the second signal, and a control terminal of the sixth transistor being connected to the read control signal line. The second read-write control circuit includes: a seventh transistor, a first terminal of the seventh transistor being connected to the complementary local signal line, a second terminal of the seventh transistor being connected to the complementary global signal line, and a control terminal of the seventh transistor being connected to the write control signal line; an eighth transistor, a first terminal of the eighth transistor being connected to the complementary global signal line, and a control terminal of the eighth transistor being connected to the local signal line; and a ninth transistor, a first terminal of the ninth transistor being connected to a second terminal of the eighth transistor, a second terminal of the ninth transistor being configured to receive the second signal, and a control terminal of the ninth transistor being connected to the read control signal line.

In an exemplary embodiment of the present disclosure, the local sensing amplifier further includes: a second signal control circuit, a first terminal of the second signal control circuit being connected to the first read-write control circuit and the second read-write control circuit, and a second terminal of the second signal control circuit being configured to receive the second signal. Controlled by a preset enable signal, the second signal control circuit is configured to transmit the second signal to the first read-write control circuit and the second read-write control circuit when the preset enable signal is in the enabled state.

In an exemplary embodiment of the present disclosure, the second signal control circuit includes a tenth transistor, where a first terminal of the tenth transistor is connected to the first read-write control circuit and the second read-write control circuit, a second terminal of the tenth transistor is configured to receive the second signal, and a control terminal of the tenth transistor is configured to receive the preset enable signal.

In an exemplary embodiment of the present disclosure, the second signal is a low-level signal, and the first signal is a high-level signal.

In an exemplary embodiment of the present disclosure, the local sensing amplifier is further connected to a read control signal line and a write control signal line, where the read control signal line is configured to transmit the read control signal, and the write control signal line is configured to transmit the write control signal. The local sensing amplifier further includes: a read control circuit, a first write control circuit, and a second write control circuit. The read control circuit is connected to the global signal line, the complementary local signal line and the read control signal line. The read control circuit is configured to output a second signal to the global signal line when the complementary local signal line transmits a first signal and the read control signal is in an enabled state. The first write control circuit is connected to the global signal line, the local signal line and the write control signal line, and the first write control circuit is configured to transmit the signal on the global signal line to the local signal line when the write control signal is in an enabled state. The second write control circuit is connected to the global signal line, the complementary local signal line and the write control signal line, and the second write control circuit is configured to output the second signal to the complementary local signal line when the write control signal is in an enabled state and the global signal line transmits the first signal.

In an exemplary embodiment of the present disclosure, the local sensing amplifier further includes an auxiliary read-write circuit connected to the first write control circuit, the local signal line and the complementary local signal line. The auxiliary read-write circuit is configured to output the first signal to the complementary local signal line when the write control signal is in the enabled state and the global signal line transmits the second signal. The auxiliary read-write circuit is further configured to amplify a signal transmitted by the local signal line and a signal transmitted by the complementary local signal line when the read control signal is in the enabled state.

In an exemplary embodiment of the present disclosure, the auxiliary read-write circuit includes a second signal auxiliary circuit configured to receive the second signal. Controlled by a preset enable signal, the second signal auxiliary circuit is configured to transmit the second signal to the complementary local signal line when the preset enable signal is in an enabled state and a voltage transmitted by the local signal line is greater than a voltage transmitted by the complementary local signal line, and to transmit the second signal to the local signal line when the preset enable signal is in the enabled state and the voltage transmitted by the local signal line is smaller than the voltage transmitted by the complementary local signal line.

In an exemplary embodiment of the present disclosure, the auxiliary read-write circuit is further connected to the preset voltage source, where the preset voltage source is configured to provide the first voltage when the read control signal is in the enabled state. The auxiliary read-write circuit is further configured to output the first signal to the local signal line when a voltage transmitted by the local signal line is greater than a voltage transmitted by the complementary local signal line, and to output the first signal to the complementary local signal line when the voltage transmitted by the local signal line is smaller than the voltage transmitted by the complementary local signal line, where the first signal is equivalent to the first voltage.

In an exemplary embodiment of the present disclosure, the read control circuit includes a fourth transistor, where a first terminal of the fourth transistor is connected to the local signal line, a second terminal of the fourth transistor is connected to the global signal line, and a control terminal of the fourth transistor is connected to the write control signal line. The first write control circuit includes: a fifth transistor, a first terminal of the fifth transistor being connected to the global signal line, and a control terminal of the fifth transistor being connected to the complementary local signal line; and a sixth transistor, a first terminal of the sixth transistor being connected to a second terminal of the fifth transistor, a second terminal of the sixth transistor being configured to receive the second signal, and a control terminal of the sixth transistor being connected to the read control signal line. The second write control circuit includes: an eleventh transistor, a first terminal of the eleventh transistor being connected to the complementary local signal line, and a control terminal of the eleventh transistor being connected to the global signal line; and a twelfth transistor, a first terminal of the twelfth transistor being connected to a second terminal of the eleventh transistor, a second terminal of the twelfth transistor being configured to receive the second signal, and a control terminal of the twelfth transistor being connected to the write control signal line.

In an exemplary embodiment of the present disclosure, the auxiliary read-write circuit includes: a thirteenth transistor, a first terminal of the thirteenth transistor being connected to the preset voltage source, a second terminal of the thirteenth transistor being connected to the complementary local signal line, and a control terminal of the thirteenth transistor being connected to the local signal line; a fourteenth transistor, a first terminal of the fourteenth transistor being connected to the preset voltage source, a second terminal of the fourteenth transistor being connected to the local signal line, and a control terminal of the fourteenth transistor being connected to the complementary local signal line; a fifteenth transistor, a first terminal of the fifteenth transistor being connected to the local signal line, a second terminal of the fifteenth transistor being configured to receive the second signal, and a control terminal of the fifteenth transistor being connected to the complementary local signal line; and a sixteenth transistor, a first terminal of the sixteenth transistor being connected to the complementary local signal line, a second terminal of the sixteenth transistor being configured to receive the second signal, and a control terminal of the sixteenth transistor being connected to the local signal line.

In an exemplary embodiment of the present disclosure, the second signal auxiliary circuit includes a seventeenth transistor, where a first terminal of the seventeenth transistor is connected to the second terminal of the fifteenth transistor and the second terminal of the sixteenth transistor, a second terminal of the seventeenth transistor is configured to receive the second signal, and a control terminal of the seventeenth transistor is configured to receive the preset enable signal. The second signal auxiliary circuit is configured to output the second signal to the fifteenth transistor and the sixteenth transistor when the preset enable signal is in the enabled state.

In an exemplary embodiment of the present disclosure, the preset voltage source is simultaneously connected to a plurality of local sensing amplifiers.

In an exemplary embodiment of the present disclosure, the preset voltage source is arranged in a row decoding and control circuit. The preset voltage source includes: a first switch element, a first terminal of the first switch element being connected to the first voltage, a second terminal of the first switch element being connected to an output terminal of the preset voltage source, and a control terminal of the first switch element being connected to a first voltage output control signal; a second switch element, a first terminal of the second switch element being connected to the second voltage, a second terminal of the second switch element being connected to the output terminal of the preset voltage source, and a control terminal of the second switch element being connected to a second voltage output control signal; and a voltage switching subcircuit connected to the first switch element and the second switch element, where the voltage switching subcircuit is configured to output the first voltage output control signal in the read-write interval, and output the second voltage output control signal in the idle period.

In an exemplary embodiment of the present disclosure, the precharge circuit is arranged in the sense amplifier array.

According to a second aspect of the present disclosure, a memory is provided, including: a plurality of memory arrays, a sense amplifier array being arranged between adjacent two of the plurality of memory arrays, and each of the sense amplifier arrays being connected to adjacent two of the plurality of memory arrays; the local sensing amplifier according to any one of the above embodiments, the local sensing amplifier being connected to a global signal line, and being connected to the sense amplifier array by means of a local signal line and a complementary local signal line; and a row decoding and control circuit provided with a preset voltage source, the preset voltage source being configured to output a first voltage and a second voltage to the local sensing amplifier.

In the embodiments of the present disclosure, by modifying a circuit structure of the local sensing amplifier, one local sensing amplifier is provided to connect different power supply voltages, and by adjusting a control sequence, the local sensing amplifier may be caused to connect different power supply voltages in different operating stages to implement different functions. Two parts of the local sensing amplifier (LSA) may be integrated to reduce the layout area of the LSA.

It is to be understood that the above general description and the detailed description below are merely exemplary and explanatory, and do not limit the present disclosure.

BRIEF DESCRIPTION OF THE DRAWINGS

The accompanying drawings herein are incorporated in and constitute a part of this specification, illustrate embodiments conforming to the present disclosure and, together with the specification, serve to explain the principles of the present disclosure. Apparently, the accompanying drawings in the following description show merely some embodiments of the present disclosure, and persons of ordinary skill in the art may still derive other drawings from these accompanying drawings without creative efforts.

DETAILED DESCRIPTION

Figure 1:
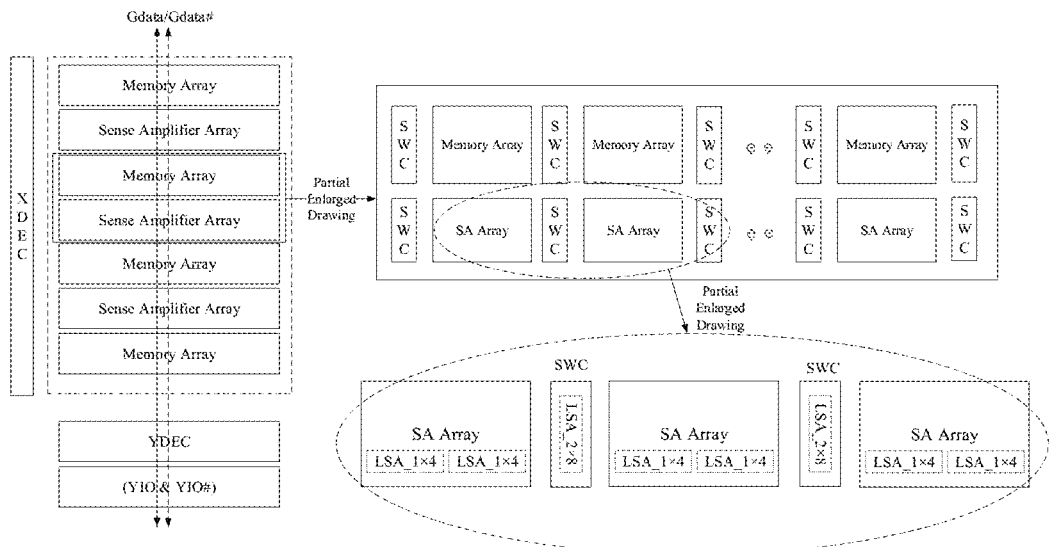
FIG. 1 is a schematic diagram of a local sensing amplifier in the existing technologies.

Exemplary embodiments will now be described more comprehensively with reference to the accompanying drawings. However, the exemplary embodiments can be embodied in many forms and should not be construed as being limited to the embodiments set forth herein; rather, these embodiments are provided such that the present disclosure will be more thorough and complete, and the concept of the exemplary embodiments will be fully conveyed to those skilled in the art. Furthermore, the described features, structures, or characteristics may be combined in any suitable manner in one or more embodiments. In the following description, numerous details are provided to provide a thorough understanding of the embodiments of the present disclosure. Those skilled in the art will recognize, however, that the technical solution of the present disclosure may be practiced without one or more of the details described, or that other methods, components, devices, steps and so on may be employed. In other instances, well-known technical solutions are not shown or described in detail to avoid obscuring aspects of the present disclosure.

Furthermore, the accompanying drawings are merely schematic illustrations of the present disclosure. Same or similar parts are denoted by same reference numbers in the drawings and, thus, a detailed description thereof will be omitted. Some block diagrams shown in the figures are functional entities and not necessarily to be corresponding to a physically or logically individual entities. These functional entities may be implemented in software form, or implemented in one or more hardware circuits or integrated circuits, or implemented in different networks and/or processor apparatuses and/or microcontroller apparatuses.

A detailed description of the exemplary embodiments of the present disclosure will be made in the following with reference to the accompanying drawings.

Figure 2:
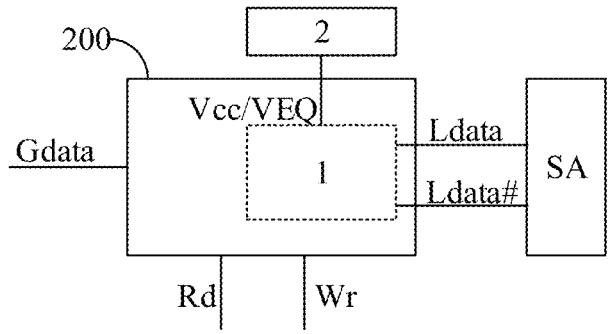
FIG. 2 is a schematic structural diagram of a local sensing amplifier according to an exemplary embodiment of the present disclosure.

FIG. 2 is a schematic structural diagram of a local sensing amplifier according to an exemplary embodiment of the present disclosure.

Referring to FIG. 2, a local sensing amplifier 200 is connected to a global signal line Gdata, and is connected to a sense amplifier array SA by means of a local signal line Ldata and a complementary local signal line Ldata #. The local sensing amplifier 200 is configured to transmit a signal on the local signal line Ldata to the global signal line Gdata when a read control signal Rd is received, and to transmit a signal on the global signal line Gdata to the local signal line Ldata when a write control signal Wr is received. The local sensing amplifier 200 may include:

a precharge circuit 1 connected to a preset voltage source 2, the local signal line Ldata and the complementary local signal line Ldata #. The preset voltage source 2 is configured to provide a first voltage Vcc in a read-write interval and provide a second voltage VEQ in an idle period. The precharge circuit 1 is configured to transmit the first voltage Vcc to the local signal line Ldata and the complementary local signal line Ldata # in the read-write interval, and to transmit the second voltage VEQ to the local signal line Ldata and the complementary local signal line Ldata # in the idle period, where the second voltage VEQ is smaller than the first voltage Vcc.

In the embodiments of the present disclosure, the precharge circuit 1 is arranged in the sense amplifier array SA.

Compared with the existing technologies where the local sensing amplifier is divided into two parts, in the embodiments of the present disclosure, the precharge circuit 1 capable of providing two voltages may transmit different voltages to the local signal line Ldata and the complementary local signal line Ldata # in different operating states, such that number of components and a layout area can be reduced for the local sensing amplifier.

The embodiments of the present disclosure will be described in detail below.

Figure 3:
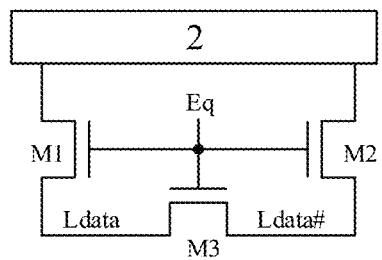
FIG. 3 is a circuit diagram of a precharge circuit according to one embodiment of the present disclosure.

FIG. 3 is a circuit diagram of a precharge circuit according to one embodiment of the present disclosure;

Referring to FIG. 3, in one embodiment, the precharge circuit 1 includes:

a first transistor M1, the first terminal of the first transistor M1 being connected to the preset voltage source 2, a second terminal of the first transistor M1 being connected to the local signal line Ldata, and a control terminal of the first transistor M1 being connected to a precharge signal line Eq;

a second transistor M2, a first terminal of the second transistor M2 being connected to the preset voltage source 2, a second terminal of the second transistor M2 being connected to the complementary local signal line Ldata #, and a control terminal of the second transistor M2 being connected to the precharge signal line Eq; and a third transistor M3, a first terminal of the third transistor M3 being connected to the local signal line Ldata, a second terminal of the third transistor M3 being connected to the complementary local signal line Ldata #, and a control terminal of the third transistor M3 being connected to the precharge signal line Eq.

The precharge signal line Eq is configured to transmit a precharge signal, which is configured for controlling voltage setting of the local signal line Ldata and the complementary local signal line Ldata # in different operating states. When the precharge signal is a high-level signal, the first transistor M1, the second transistor M2 and the third transistor M3 may all be N-type transistors, and in response to the precharge signal, the local signal line Ldata and the complementary local signal line Ldata # are set to be equivalent, and are equivalent to the first voltage Vcc or the second voltage VEQ.

In other embodiments, the precharge circuit 1 may also be implemented by other components, which are not particularly limited in the present disclosure.

Figure 4:
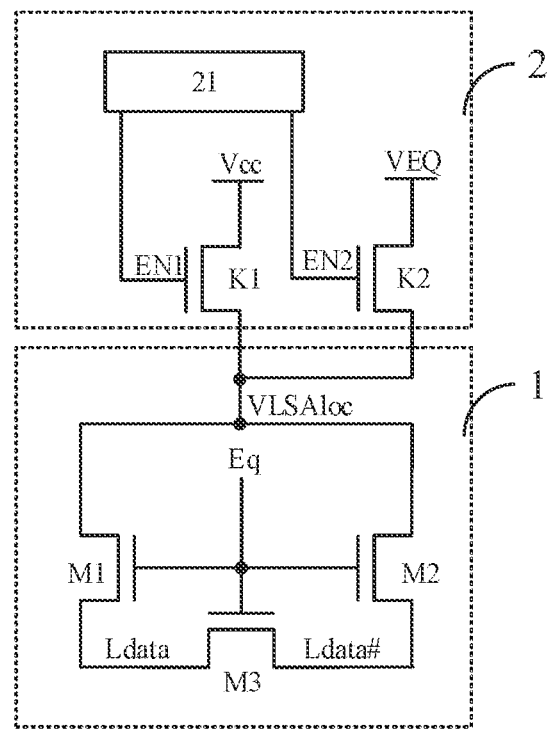
FIG. 4 is a schematic diagram of a preset voltage source according to one embodiment of the present disclosure.

FIG. 4 is a schematic diagram of a preset voltage source according to one embodiment of the present disclosure;

Referring to FIG. 4, in the embodiment of the present disclosure, the preset voltage source 2 is arranged in a row decoding and control circuit (X Decoder, XDEC), and the preset voltage source 2 includes:

a first switch element K1, a first terminal of the first switch element K1 being connected to the first voltage, a second terminal of the first switch element K1 being connected to an output terminal of the preset voltage source 2, and a control terminal of the first switch element K1 being connected to a first voltage output control signal;

a second switch element K2, a first terminal of the second switch element K2 being connected to the second voltage, a second terminal of the second switch element K2 being connected to the output terminal of the preset voltage source 2, and a control terminal of the second switch element K2 being connected to a second voltage output control signal EN2; and a voltage switching subcircuit 21 connected to the first switch element K1 and the second switch element K2, where the voltage switching subcircuit 21 is configured to output the first voltage output control signal EN1 in the read-write interval, and output the second voltage output control signal EN2 in the idle period.

A voltage outputted from the output terminal of the preset voltage source 2 may be marked as a mode voltage VLSAloc. From the above embodiments it may be known that the mode voltage VLSAloc is equivalent to the first voltage Vcc in the read-write interval and is equivalent to the second voltage VEQ in the idle period.

The voltage switching subcircuit 21 may be a controller in the XDEC. According to different types of the first voltage output control signal EN1 and the second voltage output control signal EN2 outputted by the voltage switching subcircuit 21, the first switch element K1 and the second switch element K2 may be implemented by means of transistors or other components. In the embodiment as shown in FIG. 4, both the first switch element K1 and the second switch element K2 are N-type transistors. In other embodiments, the first switch element K1 and the second switch element K2 may also be other elements.

In the embodiment of the present disclosure, the preset voltage source 2 is simultaneously connected to a plurality of local sensing amplifiers. That is, the preset voltage source 2 is simultaneously connected to a plurality of precharge circuits 1.

By means of the preset voltage source 2 arranged in the XDEC to provide the first voltage Vcc and the second voltage VEQ in different operating periods, two functions of the local sensing amplifier may be implemented by means of one precharge circuit 1, and each read-write conversion circuit may be only provided with one precharge circuit 1. The read-write conversion circuit is only arranged in the SA array, there is no need to arrange another part (in the prior art, this part generally is two sets of voltage transmission circuits controlled by control signals corresponding to two operating states) of the read-write conversion circuit in an SWC circuit, and thus there is no need to consider arrangement and area of the two voltage transmission circuits in layout, which can greatly save the number of components and the layout area for the local sensing amplifier.

Figure 5:
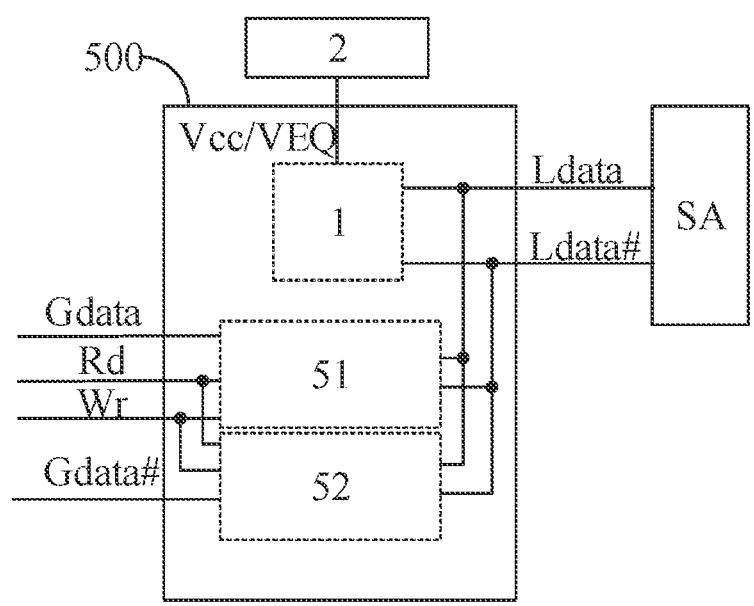
FIG. 5 is a schematic diagram of a local sensing amplifier according to one embodiment of the present disclosure.

FIG. 5 is a schematic diagram of a local sensing amplifier according to one embodiment of the present disclosure;

Referring to FIG. 5, in one embodiment, on the basis of the local sensing amplifier 200, a local sensing amplifier 500 is further connected to a complementary global signal line Gdata #, a read control signal line and a write control signal line, where the read control signal line is configured to transmit the read control signal Rd, and the write control signal line is configured to transmit the write control signal Wr. The local sensing amplifier 500 further includes:

a first read-write control circuit 51 connected to the local signal line Ldata, the complementary local signal line Ldata #, the global signal line Gdata, the read control signal line Rd and the write control signal line Wr, where the first read-write control circuit 51 is configured to transmit the signal on the global signal line Gdata to the local signal line Ldata when the write control signal is in an enabled state, and output a second signal S2 to the global signal line Gdata when the read control signal is in the enabled state and the complementary local signal line Ldata # transmits a first signal S1, the second signal S2 being inverse in phase to the first signal S1; and a second read-write control circuit 52 connected to the local signal line Ldata, the complementary local signal line Ldata #, the complementary global signal line Gdata #, the read control signal line Rd and the write control signal line Wr, where the second read-write control circuit 52 is configured to transmit a signal on the complementary global signal line Gdata # to the complementary local signal line Ldata # when the write control signal is in an enabled state, and output the second signal S2 to the complementary global signal line Gdata # when the read control signal is in the enabled state and the local signal line Ldata transmits the first signal S1.

Figure 6A:
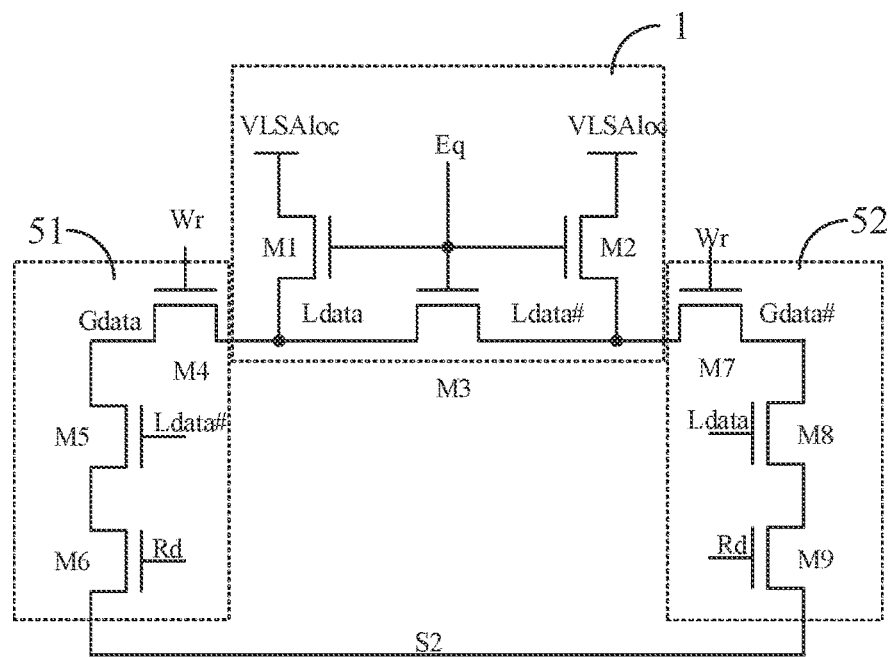
FIG. 6A and FIG. 6B respectively are schematic diagrams of two circuit embodiments of the local sensing amplifier as shown in FIG. 5.
Figure 6B:
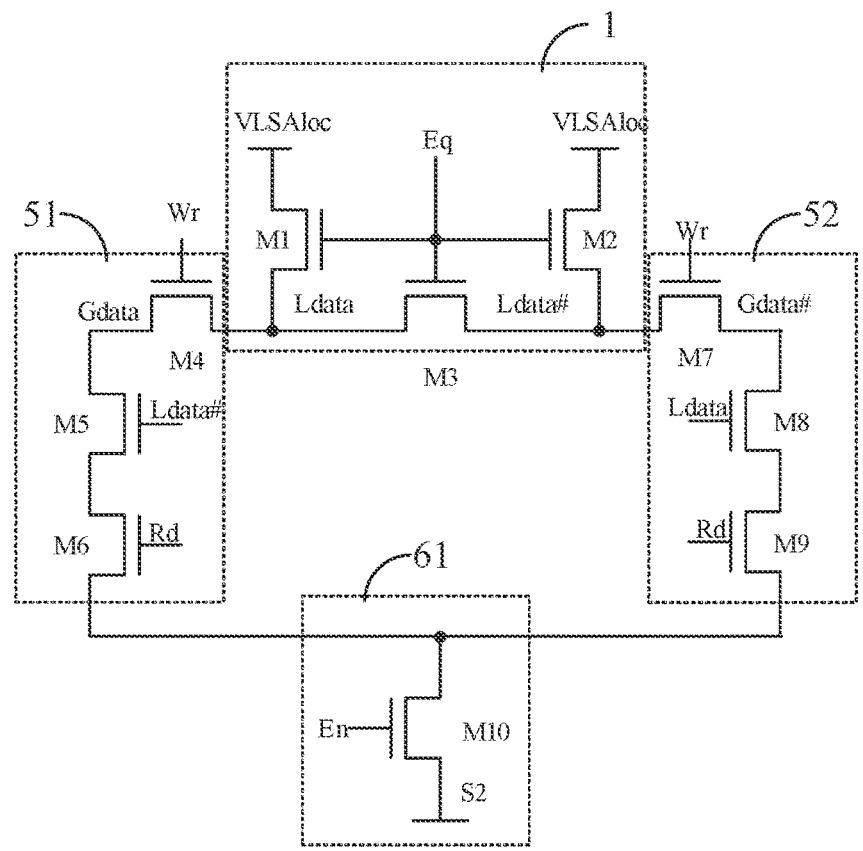

FIG. 6A and FIG. 6B respectively are schematic diagrams of two circuit embodiments of the local sensing amplifier as shown in FIG. 5;

Referring to FIG. 6A, in one embodiment, the first read-write control circuit 51 may include:

a fourth transistor M4, a first terminal of the fourth transistor M4 being connected to the local signal line Ldata, a second terminal of the fourth transistor M4 being connected to the global signal line Gdata, and a control terminal of the fourth transistor M4 being connected to the write control signal line Wr;

a fifth transistor M5, a first terminal of the fifth transistor M5 being connected to the global signal line Gdata, and a control terminal of the fifth transistor M5 being connected to the complementary local signal line Ldata #;

a sixth transistor M6, a first terminal of the sixth transistor M6 being connected to a second terminal of the fifth transistor M5, a second terminal of the sixth transistor M6 being configured to receive the second signal S2, and a control terminal of the sixth transistor M6 being connected to the read control signal line Rd.

The second read-write control circuit 52 may include:

a seventh transistor M7, a first terminal of the seventh transistor M7 being connected to the complementary local signal line Ldata #, a second terminal of the seventh transistor M7 being connected to the complementary global signal line Gdata #, and a control terminal of the seventh transistor M7 being connected to the write control signal line Wr;

an eighth transistor M8, a first terminal of the eighth transistor M8 being connected to the complementary global signal line Gdata #, and a control terminal of the eighth transistor M8 being connected to the local signal line Ldata; and a ninth transistor M9, a first terminal of the ninth transistor M9 being connected to a second terminal of the eighth transistor M8, a second terminal of the ninth transistor M9 being configured to receive the second signal S2, and a control terminal of the ninth transistor M9 being connected to the read control signal line Rd.

An operating principle of the embodiment as shown in FIG. 6A is as below.

During the read-write interval, a precharge phase is entered, the precharge signal is in the enabled state, the first transistor M1 and the second transistor M2 are enabled, and the signal on the local signal line Ldata and the signal on the complementary local signal line Ldata # are equivalent to the first voltage Vcc, and are manifested as a logic level signal 1. Next, the precharge signal enters a disabled state, and the precharge phase is ended.

When the read control signal is in the enabled state, the write control signal is in the disabled state, and the sixth transistor M6 and the ninth transistor M9 are enabled. At this moment, a gate of the fifth transistor M5 is controlled by the complementary local signal line Ldata #, and a gate of the eighth transistor M8 is controlled by the local signal line Ldata.

When the local signal line Ldata is set to the first signal (logic level signal 1) by the sense amplifier and the complementary local signal line Ldata # is set to the second signal (logic level signal 0) by the sense amplifier, the fifth transistor M5 is disabled, the eighth transistor M8 is enabled, and the complementary global signal line Gdata # is grounded by means of the enabled eighth transistor M8 and the ninth transistor M9, and is manifested as a logic level signal of 0. The state of the complementary global signal line Gdata # is the same as that of the complementary local signal line Ldata #.

When the local signal line Ldata is set to the second signal (logic level signal 0) by the sense amplifier and the complementary local signal line Ldata # is set to the first signal (logic level signal 1) by the sense amplifier, the fifth transistor M5 is enabled, the eighth transistor M8 is disabled, and the global signal line Gdata is grounded by means of the enabled fifth transistor M5 and the sixth transistor M6, and is embodied as the logic level signal 0. The state of the global signal line Gdata is the same as that of the local signal line Ldata.

Thus, data transmitted by the sense amplifier to the local signal line Ldata and the complementary local signal line Ldata # are correspondingly transmitted to the global signal line Gdata and the complementary global signal line Gdata # by means of the local sensing amplifier.

When the write control signal is in the enabled state, the read control signal is in the disabled state. At this moment, the fourth transistor M4 and the seventh transistor M7 are enabled, the state of the global signal line Gdata is the same as the state of the local signal line Ldata, and the state of the complementary global signal line Gdata # is the same as that of the complementary local signal line Ldata #. The data on the global signal line Gdata and the data on the complementary global signal line Gdata # are correspondingly transmitted to the local signal line Ldata and the complementary local signal line Ldata # by means of the local sensing amplifier, and then are transmitted to the sense amplifier by means of the local signal line Ldata and the complementary local signal line Ldata #.

During the idle period (for example, when a read-write process is ended), after the precharge phase is ended, the third transistor M3 is disabled, and a voltage of the local signal line Ldata is equal to that of the complementary local signal line Ldata #, both being equal to or lower than the first voltage Vcc or the second voltage VEQ. At this moment, both the read control signal and the write control signal are in the disabled state, neither the first read-write control circuit 51 nor the second read-write control circuit 52 runs, and the circuit operates at lower power consumption.

Referring to FIG. 6B, in one embodiment, the local sensing amplifier may further include:

a second signal control circuit 61, a first terminal of the second signal control circuit 61 being connected to the first read-write control circuit 51 and the second read-write control circuit 52, and a second terminal of the second signal control circuit 61 being configured to receive the second signal S2, and controlled by a preset enable signal En, the second signal control circuit 61 being configured to transmit the second signal S2 to the first read-write control circuit 51 and the second read-write control circuit 52 when the preset enable signal En is in the enabled state.

In the embodiment as shown in FIG. 6B, the second signal control circuit 61 may include:

a tenth transistor M10, a first terminal of the tenth transistor M10 being connected to the first read-write control circuit 51 and the second read-write control circuit 52, a second terminal of the tenth transistor M10 being configured to receive the second signal S2, and a control terminal of the tenth transistor M10 being configured to receive the preset enable signal En. In the embodiment as shown in FIG. 6, the second signal S2 is equal to the logic level signal 0, and the first signal S1 is equal to the logic level signal 1.

In the embodiments as shown in FIG. 6A and FIG. 6B, the fourth transistor M4, the fifth transistor M5, the sixth transistor M6, the seventh transistor M7, the eighth transistor M8, the ninth transistor M9 and the tenth transistor M10 are all N-type transistors, the second signal S2 is the logic level signal 0, and the first signal S1 is the logic level signal 1.

The circuits as shown in FIG. 6A and FIG. 6B are only examples. In other embodiments, functions of the circuits as shown in FIG. 6A and FIG. 6B may also be implemented by means of other logic circuits. When the functions of the circuits as shown in FIG. 6A and FIG. 6B are implemented by other means, other relationships may be established between the first signal S1 and the second signal S2, which is not particularly limited in the present disclosure.

Figure 7:
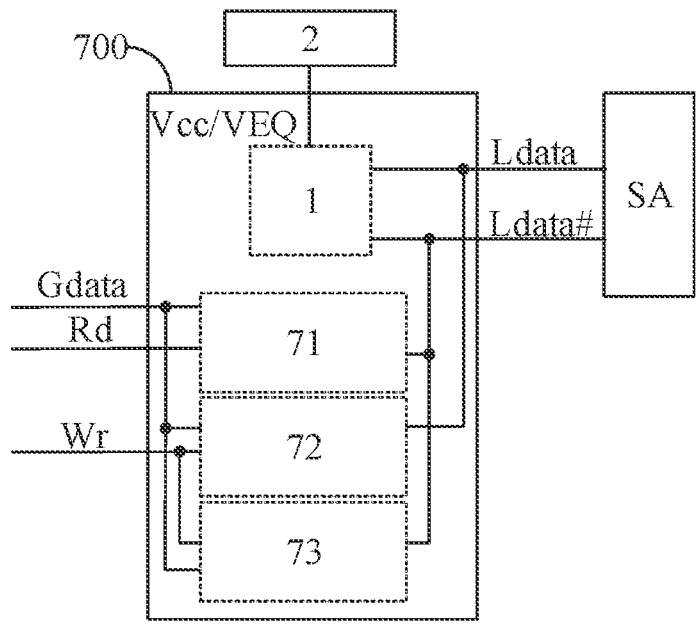
FIG. 7 is a schematic diagram of a local sensing amplifier according to another embodiment of the present disclosure.

FIG. 7 is a schematic diagram of a local sensing amplifier according to another embodiment of the present disclosure;

Referring to FIG. 7, in one embodiment, on the basis of the local sensing amplifier 200, a local sensing amplifier 700 is further connected to a read control signal line Rd and a write control signal line Wr, where the read control signal line Rd is configured to transmit the read control signal, and the write control signal line Wr is configured to transmit the write control signal. The local sensing amplifier 700 also includes:

a read control circuit 71 connected to the global signal line Gdata, the complementary local signal line Ldata # and the read control signal line Rd, the read control circuit 71 being configured to output a second signal S2 to the global signal line Gdata when the complementary local signal line Ldata # transmits a first signal S1 and the read control signal is in an enabled state;

a first write control circuit 72 connected to the global signal line Gdata, the local signal line Ldata and the write control signal line Wr, the first write control circuit 72 being configured to transmit the signal on the global signal line Gdata to the local signal line Ldata when the write control signal is in an enabled state; and a second write control circuit 73 connected to the global signal line Gdata, the complementary local signal line Ldata # and the write control signal line Wr, the second write control circuit 73 being configured to output the second signal S2 to the complementary local signal line Ldata # when the write control signal is in an enabled state and the global signal line Gdata transmits the first signal S1.

Figure 8:
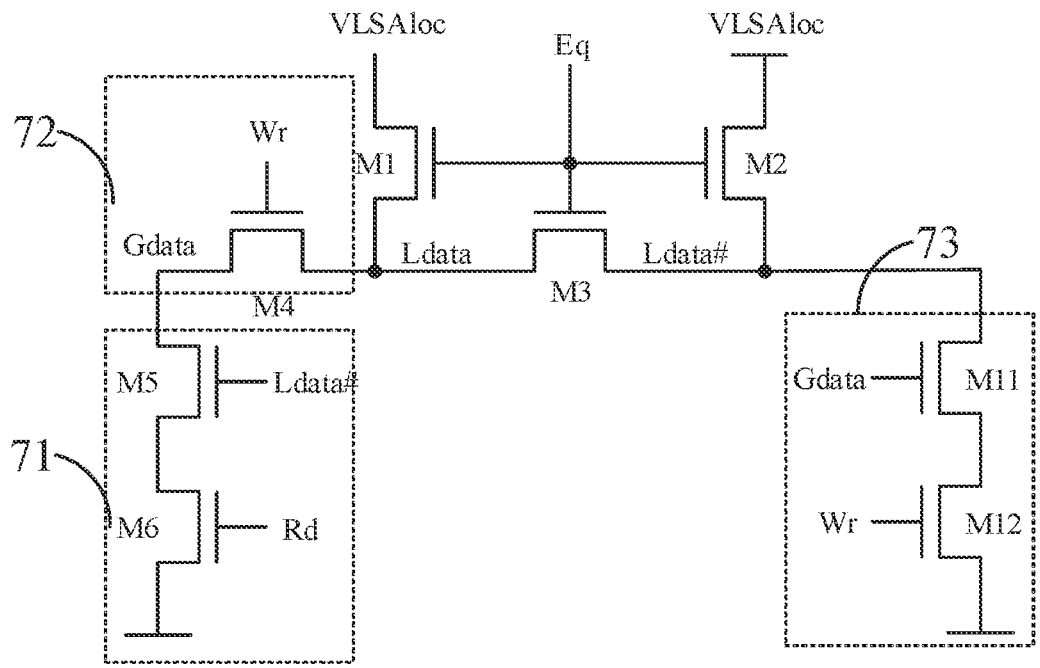
FIG. 8 is a schematic diagram of one circuit embodiment of the local sensing amplifier as shown in FIG. 7.

FIG. 8 is a schematic diagram of one circuit embodiment of the local sensing amplifier as shown in FIG. 7.

Referring to FIG. 8, in one embodiment, the read control circuit 71 includes a fourth transistor M4, where a first terminal of the fourth transistor M4 is connected to the local signal line Ldata, a second terminal of the fourth transistor M4 is connected to the global signal line Gdata, and a control terminal of the fourth transistor M4 is connected to the write control signal line Wr.

The first write control circuit 72 includes:

a fifth transistor M5, a first terminal of the fifth transistor M5 being connected to the global signal line Gdata, and a control terminal of the fifth transistor M5 being connected to the complementary local signal line Ldata #; and a sixth transistor M6, a first terminal of the sixth transistor M6 being connected to a second terminal of the fifth transistor M5, a second terminal of the sixth transistor M6 being configured to receive the second signal S2, and a control terminal of the sixth transistor M6 being connected to the read control signal line Rd.

The second write control circuit 73 includes:
an eleventh transistor M11, a first terminal of the eleventh transistor M11 being connected to the complementary local signal line Ldata #, and a control terminal of the eleventh transistor M11 being connected to the global signal line Gdata; and
a twelfth transistor M12, a first terminal of the twelfth transistor M12 being connected to a second terminal of the eleventh transistor M11, a second terminal of the twelfth transistor M12 being configured to receive the second signal S2, and a control terminal of the twelfth transistor M12 being connected to the write control signal line Wr.

In the embodiment shown in FIG. 8, the fourth transistor M4, the fifth transistor M5, the sixth transistor M6, the eleventh transistor M11 and the twelfth transistor M12 are all N-type transistors, the first signal S1 is a logic level signal 1, and the second signal S2 is a logic level signal 0.

An operating process of the embodiment as shown in FIG. 8 is as below.

During the read-write interval, a precharge phase is entered, the precharge signal is in the enabled state, the first transistor M1 and the second transistor M2 are enabled, and the signal on the local signal line Ldata and the signal on the complementary local signal line Ldata # are equivalent to the first voltage Vcc, and are manifested as a logic level signal 1. Next, the precharge signal enters a disabled state, and the precharge phase is ended.

When the read control signal is in the enabled state, the write control signal is in the disabled state, and the sixth transistor M6 is enabled. At this moment, the gate of the fifth transistor M5 is controlled by the complementary local signal line Ldata #. First, the global signal line Gdata is precharged to the first voltage Vcc, which is manifested as the logic level signal 1. When the complementary local signal line Ldata # is set to the second signal (the logic level signal 0) by the sense amplifier, the fifth transistor M5 is disabled. In this case, the global signal line Gdata is remained at the first voltage Vcc, and is manifested as the logic level signal 1.

When the complementary local signal line Ldata # is set to the first signal (the logic level signal 1) by the sense amplifier, this means that the local signal line Ldata is set to the second signal (the logic level signal 0) by the sense amplifier at this moment, the fifth transistor M5 is enabled, and the global signal line Gdata is grounded by means of the enabled fifth transistor M5 and the sixth transistor M6, and is embodied as the logic level signal 0. The state of the global signal line Gdata is the same as that of the local signal line Ldata.

When the write control signal is in the enabled state, the read control signal is in the disabled state. At this moment, the fourth transistor M4 is enabled, and the state of the global signal line Gdata is the same as that of the local signal line Ldata. That is, the data on the global signal line Gdata are transmitted to the local signal line Ldata, and then are transmitted to the sense amplifier by means of the local signal line Ldata.

In this case, when the global signal line Gdata transmits the logic level signal 1, the eleventh transistor M11 is enabled, and the complementary local signal line Ldata # is grounded by means of the enabled eleventh transistor M11 and the twelfth transistor M12, and is embodied as the logic level signal 0, which is opposite to the state of the local signal line Ldata. When the global signal line Gdata transmits the logic level signal 0, the eleventh transistor M11 is disabled, and the complementary local signal line Ldata # still maintains the logic level signal 1 at the end of the precharge state, which is opposite to the state of the local signal line Ldata. Thereby, the signal on the global signal line Gdata is transmitted to the sense amplifier by means of the local signal line Ldata and the complementary local signal line Ldata # which are in opposite states.

During the idle period, after the precharge phase is ended, the third transistor M3 is disabled, and the voltage of the local signal line Ldata is equal to that of the complementary local signal line Ldata #, both being equal to or lower than the first voltage Vcc or the second voltage VEQ. At this moment, both the read control signal and the write control signal are in the disabled state, none of the read control circuit 71, the first write control circuit 72 and the second write control circuit 73 runs, and the circuit operates at lower power consumption.

Figure 9:
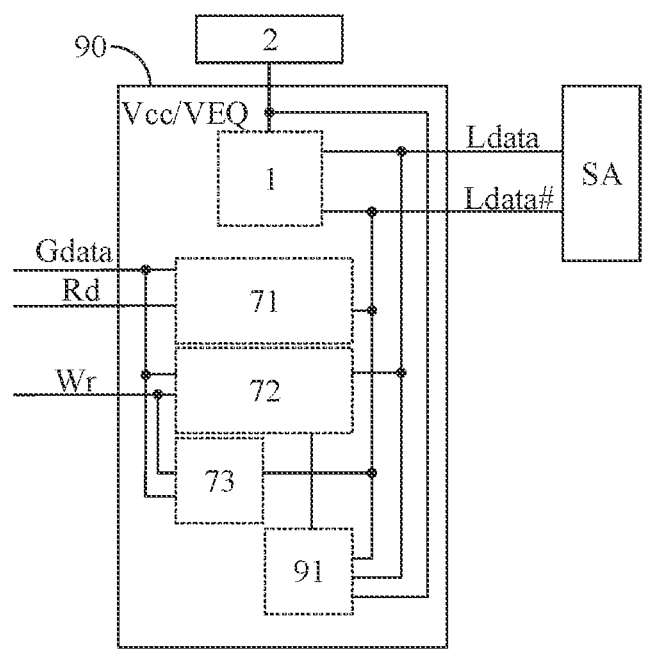
FIG. 9 is a schematic diagram of the local sensing amplifier as shown in FIG. 7 according to one embodiment.

FIG. 9 is a schematic diagram of the local sensing amplifier as shown in FIG. 7 according to one embodiment.

Referring to FIG. 9, in one embodiment, on the basis of the local sensing amplifier 700, a local sensing amplifier 900 further includes:
an auxiliary read-write circuit 91 connected to the first write control circuit 72, the local signal line Ldata and the complementary local signal line Ldata #, where the auxiliary read-write circuit 91 is configured to output the first signal S1 to the complementary local signal line Ldata # when the write control signal is in the enabled state and the global signal line Gdata transmits the second signal S2.

The auxiliary read-write circuit 91 is further configured to amplify a signal transmitted by the local signal line Ldata and a signal transmitted by the complementary local signal line Ldata # when the read control signal Rd is in the enabled state.

In one embodiment, the auxiliary read-write circuit 91 is further connected to a preset voltage source 2, which is configured to provide the first voltage Vcc when the read control signal is in the enabled state. The auxiliary read-write circuit 91 is further configured to output the first signal S1 to the local signal line Ldata when a voltage transmitted by the local signal line Ldata is greater than a voltage transmitted by the complementary local signal line Ldata #, and to output the first signal S1 to the complementary local signal line Ldata # when the voltage transmitted by the local signal line Ldata is smaller than the voltage transmitted by the complementary local signal line Ldata #, where the first signal S1 is equivalent to the first voltage Vcc.

Figure 10:
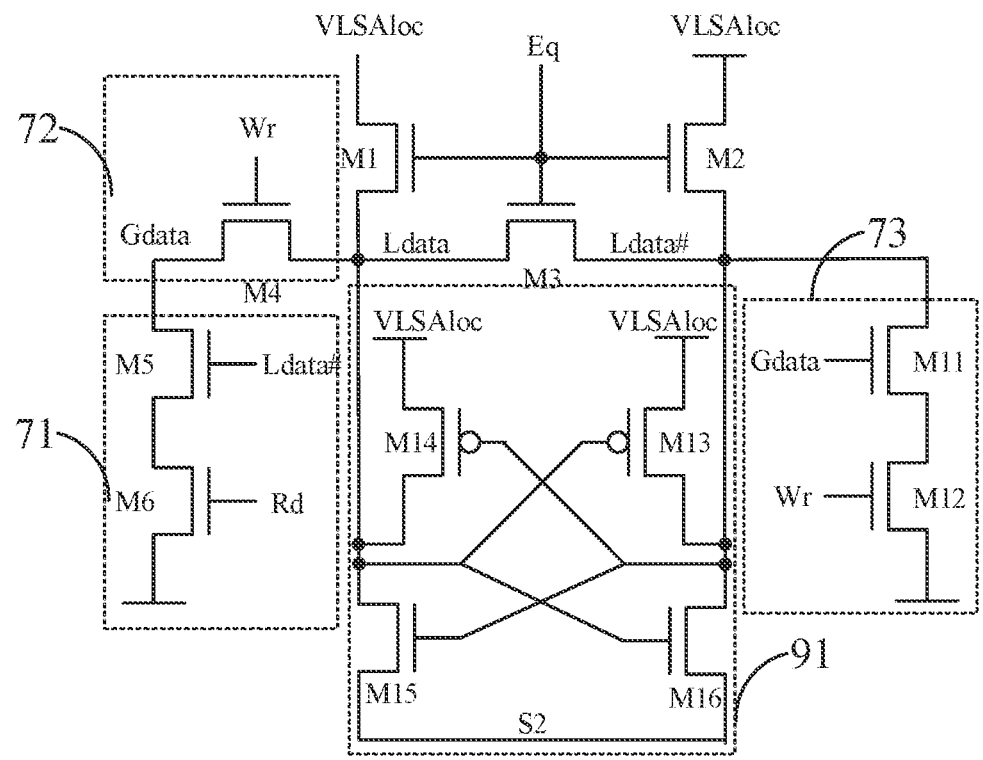
FIG. 10 is a schematic circuit diagram of the local sensing amplifier as shown in FIG. 9.

FIG. 10 is a schematic circuit diagram of the local sensing amplifier as shown in FIG. 9.

Referring to FIG. 10, in one embodiment, the auxiliary read-write circuit 91 may include:
a thirteenth transistor M13, a first terminal of the thirteenth transistor M13 being connected to the preset voltage source 2 (mode voltage VLSAloc), a second terminal of the thirteenth transistor M13 being connected to the complementary local signal line Ldata #, and a control terminal of the thirteenth transistor M13 being connected to the local signal line Ldata;
a fourteenth transistor M14, a first terminal of the fourteenth transistor M14 being connected to the preset voltage source 2 (the mode voltage VLSAloc), a second terminal of the fourteenth transistor M14 being connected to the local signal line Ldata, and a control terminal of the fourteenth transistor M14 being connected to the complementary local signal line Ldata #;

a fifteenth transistor M15, a first terminal of the fifteenth transistor M15 being connected to the local signal line Ldata, a second terminal of the fifteenth transistor M15 being configured to receive the second signal S2, and a control terminal of the fifteenth transistor M15 being connected to the complementary local signal line Ldata #; and a sixteenth transistor M16, a first terminal of the sixteenth transistor M16 being connected to the complementary local signal line Ldata #, a second terminal of the sixteenth transistor M16 being configured to receive the second signal S2, and a control terminal of the sixteenth transistor M16 being connected to the local signal line Ldata.

In the embodiment as shown in FIG. 10, both the thirteenth transistor M13 and the fourteenth transistor M14 are P-type transistors, and the fifteenth transistor M15 and the sixteenth transistor M16 are both N-type transistors. The first signal S1 is a logic level signal 1, and the second signal S2 is a logic level signal 0.

An operating process of the auxiliary read-write circuit 91 of the embodiment as shown in FIG. 10 is as below.

No matter in the read-write interval or the idle period, after the precharge phase is ended, the third transistor M3 is disabled. In this case, when the voltage of the local signal line Ldata is higher than the voltage of the complementary local signal line Ldata #, the fourteenth transistor M14 and the sixteenth transistor M16 are enabled first, causing the thirteenth transistor M13 and the fifteenth transistor M15 to be disabled, the voltage of the local signal line Ldata connected to the second terminal of the fourteenth transistor M14 is equivalent to the mode voltage VLSAloc, and the voltage of the complementary local signal line Ldata # connected to the first terminal of the sixteenth transistor M16 is equivalent to the second signal S2, i.e., the logic level signal 0. On the contrary, when the voltage of the local signal line Ldata is lower than the voltage of the complementary local signal line Ldata #, the thirteenth transistor M13 and the fifteenth transistor M15 are enabled first, causing the fourteenth transistor M14 and the sixteenth transistor M16 to be disabled, the voltage of the local signal line Ldata connected to the first terminal of the fifteenth transistor M15 is equivalent to the second signal S2, i.e., the logic level signal 0, and the voltage of the complementary local signal line Ldata # connected to the second terminal of the thirteenth transistor M13 is equivalent to the mode voltage VLSAloc.

Therefore, as long as there is a voltage difference between the local signal line Ldata and the complementary local signal line Ldata #, the auxiliary read-write circuit 91 can amplify the voltage difference to be the mode voltage VLSAloc. The mode voltage VLSAloc varies according to operating phases, and detailed descriptions thereof are omitted here.

Figure 11:
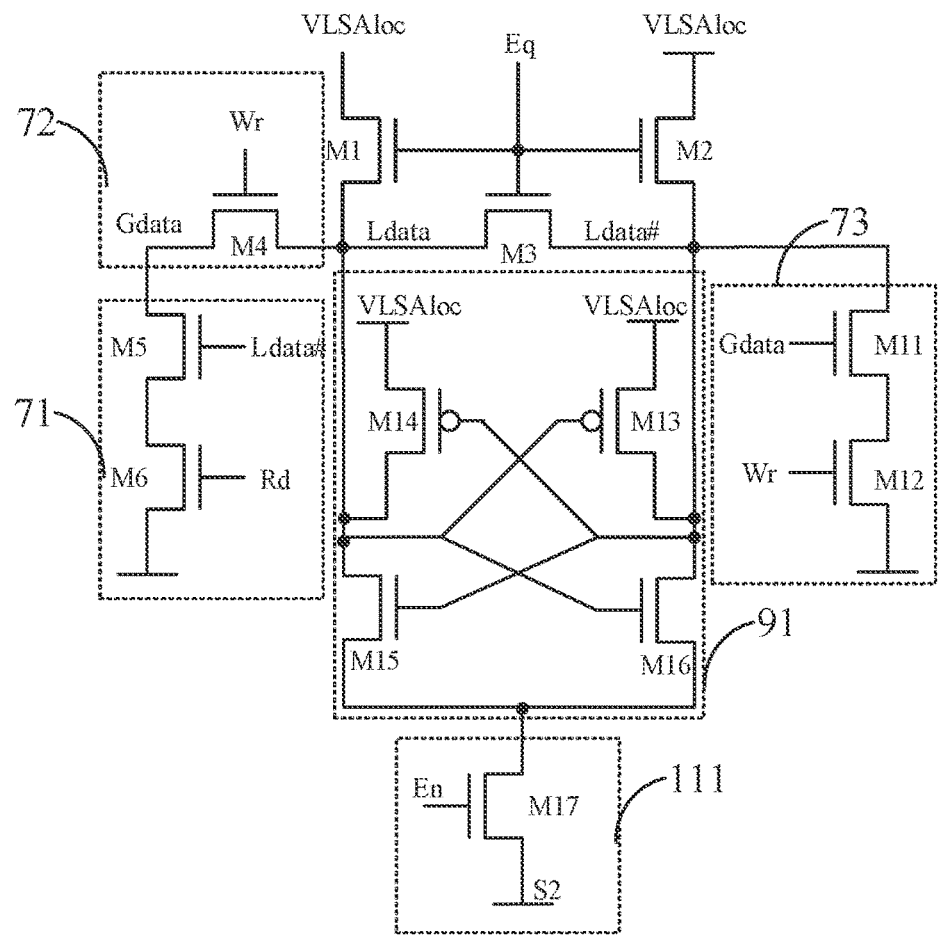
FIG. 11 is a schematic diagram of the local sensing amplifier as shown in FIG. 9 according to one embodiment.

FIG. 11 is a schematic diagram of the local sensing amplifier as shown in FIG. 9 according to one embodiment.

Referring to FIG. 11, in one embodiment, the local sensing amplifier further includes:

a second signal auxiliary circuit 111 configured to receive the second signal S2. Controlled by a preset enable signal En, the second signal auxiliary circuit 111 is configured to transmit the second signal S2 to the complementary local signal line Ldata # when the preset enable signal En is in an enabled state and a voltage transmitted by the local signal line Ldata is greater than a voltage transmitted by the complementary local signal line Ldata #, and to transmit the second signal S2 to the local signal line Ldata when the preset enable signal En is in the enabled state and the voltage transmitted by the local signal line Ldata is smaller than the voltage transmitted by the complementary local signal line Ldata #.

In the embodiment as shown in FIG. 11, when the second signal auxiliary circuit 111 is connected to the auxiliary read-write circuit 91, the second signal auxiliary circuit 111 may include:

a seventeenth transistor M17, where a first terminal of the seventeenth transistor M17 is connected to the second terminal of the fifteenth transistor M15 and the second terminal of the sixteenth transistor M16, a second terminal of the seventeenth transistor M17 is configured to receive the second signal S2, and a control terminal of the seventeenth transistor M17 is configured to receive the preset enable signal. The second signal auxiliary circuit 111 is configured to output the second signal S2 to the fifteenth transistor M15 and the sixteenth transistor M16 when the preset enable signal En is in the enabled state.

In the circuit as shown in FIG. 11, the fifteenth transistor M15 and the sixteenth transistor M16 are both N-type transistors, the fifth transistor M5 and the eleventh transistor M11 are both N-type transistors, the first signal S1 is the logic level signal 1, and the second signal S2 is the logic level signal 0.

Figure 12:
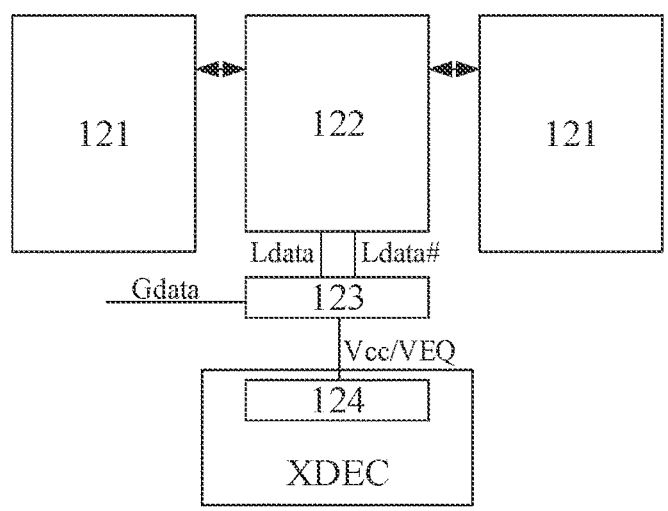
FIG. 12 is a schematic diagram of a memory according to an exemplary embodiment of the present disclosure.

FIG. 12 is a schematic diagram of a memory according to an exemplary embodiment of the present disclosure.

Referring to FIG. 12, a memory 1200 may include:

a plurality of memory arrays 121, a sense amplifier array 122 being arranged between adjacent two of the plurality of memory arrays 121, and each of the sense amplifier arrays 122 being connected to adjacent two of the plurality of memory arrays 121;

a local sensing amplifier 123 according to any one of the embodiments as shown in FIG. 2 to FIG. 11, the local sensing amplifier 123 being connected to the global signal line Gdata, and being connected to the sense amplifier array 122 by means of the local signal line Ldata and the complementary local signal line Ldata #; and a row decoding and control circuit XDEC provided with a preset voltage source 124, where the preset voltage source 124 is configured to output a first voltage Vcc and a second voltage VEQ to the local sensing amplifier 123.

In the embodiment as shown in FIG. 12, the local sensing amplifier 123 may be arranged in the sense amplifier array 122 and is connected to the sense amplifier array 122.

In the local sensing amplifier and the memory using the local sensing amplifier provided by the embodiments of the present disclosure, by arranging a precharge circuit connected to a preset voltage source connected to a plurality of local sensing amplifiers to provide two voltages in two operating states, the local sensing amplifier is allowed to set the local signal line/complementary local signal line to the first voltage or the second voltage in the two operating states in the case where only one precharge circuit is arranged, thereby reducing the number of components for the local sensing amplifier and reducing circuit complexity. The local sensing amplifier is only arranged in the sense amplifier array, such that the number of components and the layout area can be reduced for the entire storage circuit, and thus volume of the memory can be reduced.

It is to be noticed that although a plurality of circuits or subcircuits of a device for action execution have been mentioned in the above detailed description, this partition is not compulsory. Actually, according to the embodiments of the present disclosure, features and functions of two or more circuits or subcircuits as described above may be embodied in one circuit or subcircuit. Reversely, features and functions of one circuit or subcircuit as described above may be further embodied in more circuits or subcircuits.

Other embodiments of the present disclosure will be apparent to those skilled in the art from consideration of the specification and practice of the invention disclosed here. This application is intended to cover any variations, uses, or adaptations of the present disclosure following the general principles thereof and including such departures from the present disclosure as come within known or customary practice in the art. It is intended that the specification and embodiments be considered as exemplary only, with a true scope and spirit of the present disclosure being indicated by the claims.

INDUSTRIAL APPLICABILITY

In the embodiments of the present disclosure, by modifying a circuit structure of the local sensing amplifier, one local sensing amplifier is provided to connect different power supply voltages, and by adjusting a control sequence, the local sensing amplifier may be caused to connect different power supply voltages in different operating stages to implement different functions. Two parts of the local sensing amplifier (LSA) may be integrated to reduce the layout area of the LSA.

What is claimed is:

1. A local sensing amplifier connected to a global signal line and connected to a sense amplifier array by means of a local signal line and a complementary local signal line, the local sensing amplifier being configured to transmit a signal on the local signal line to the global signal line when a read control signal is received, and to transmit a signal on the global signal line to the local signal line when a write control signal is received, the local sensing amplifier comprising:
a precharge circuit connected to a preset voltage source, the local signal line and the complementary local signal line, the preset voltage source being configured to provide a first voltage in a read-write interval and provide a second voltage in an idle period, the precharge circuit being configured to transmit the first voltage to the local signal line and the complementary local signal line in the read-write interval, and to transmit the second voltage to the local signal line and the complementary local signal line in the idle period; and, wherein the second voltage is smaller than the first voltage; and the preset voltage source is arranged in a row decoding and control circuit, the preset voltage source comprising:
a first switch element, a first terminal of the first switch element being connected to the first voltage, a second terminal of the first switch element being connected to an output terminal of the preset voltage source, and a control terminal of the first switch element being connected to a first voltage output control signal;
a second switch element, a first terminal of the second switch element being connected to the second voltage, a second terminal of the second switch element being connected to the output terminal of the preset voltage source, and a control terminal of the second switch element being connected to a second voltage output control signal; and
a voltage switching subcircuit connected to the first switch element and the second switch element, the voltage switching subcircuit being configured to output the first voltage output control signal in the read-write interval, and output the second voltage output control signal in the idle period.

2. The local sensing amplifier according to claim 1, wherein the precharge circuit comprises:
a first transistor, the first terminal of the first transistor being connected to the preset voltage source, a second terminal of the first transistor being connected to the local signal line, and a control terminal of the first transistor being connected to a precharge signal line;
a second transistor, a first terminal of the second transistor being connected to the preset voltage source, a second terminal of the second transistor being connected to the complementary local signal line, and a control terminal of the second transistor being connected to the precharge signal line; and
a third transistor, a first terminal of the third transistor being connected to the local signal line, a second terminal of the third transistor being connected to the complementary local signal line, and a control terminal of the third transistor being connected to the precharge signal line.

3. The local sensing amplifier according to claim 2, wherein the first transistor, the second transistor, and the third transistor are all N-type transistors.

4. The local sensing amplifier according to claim 1, wherein the local sensing amplifier is further connected to a complementary global signal line, a read control signal line and a write control signal line, the read control signal line being configured to transmit the read control signal, the write control signal line being configured to transmit the write control signal, the local sensing amplifier further comprising:
a first read-write control circuit connected to the local signal line, the complementary local signal line, the global signal line, the read control signal line and the write control signal line, the first read-write control circuit being configured to transmit the signal on the global signal line to the local signal line when the write control signal is in an enabled state, and output a second signal to the global signal line when the read control signal is in the enabled state and the complementary local signal line transmits a first signal, the second signal being inverse in phase to the first signal; and
a second read-write control circuit connected to the local signal line, the complementary local signal line, the complementary global signal line, the read control signal line and the write control signal line, the second read-write control circuit being configured to transmit a signal on the complementary global signal line to the complementary local signal line when the write control signal is in an enabled state, and output the second signal to the complementary global signal line when the read control signal is in the enabled state and the local signal line transmits the first signal.

5. The local sensing amplifier according to claim 4, wherein the first read-write control circuit comprises:
a fourth transistor, a first terminal of the fourth transistor being connected to the local signal line, a second terminal of the fourth transistor being connected to the global signal line, and a control terminal of the fourth transistor being connected to the write control signal line;
a fifth transistor, a first terminal of the fifth transistor being connected to the global signal line, and a control terminal of the fifth transistor being connected to the complementary local signal line;
a sixth transistor, a first terminal of the sixth transistor being connected to a second terminal of the fifth transistor, a second terminal of the sixth transistor being configured to receive the second signal, and a control terminal of the sixth transistor being connected to the read control signal line;
wherein the second read-write control circuit comprises:
a seventh transistor, a first terminal of the seventh transistor being connected to the complementary local signal line, a second terminal of the seventh transistor being connected to the complementary global signal line, and a control terminal of the seventh transistor being connected to the write control signal line;
an eighth transistor, a first terminal of the eighth transistor being connected to the complementary global signal line, and a control terminal of the eighth transistor being connected to the local signal line; and
a ninth transistor, a first terminal of the ninth transistor being connected to a second terminal of the eighth transistor, a second terminal of the ninth transistor being configured to receive the second signal, and a control terminal of the ninth transistor being connected to the read control signal line.

6. The local sensing amplifier according to claim 4, further comprising:
a second signal control circuit, a first terminal of the second signal control circuit being connected to the first read-write control circuit and the second read-write control circuit, and a second terminal of the second signal control circuit being configured to receive the second signal, and controlled by a preset enable signal, the second signal control circuit being configured to transmit the second signal to the first read-write control circuit and the second read-write control circuit when the preset enable signal is in the enabled state.

7. The local sensing amplifier according to claim 6, wherein the second signal control circuit comprises:
a tenth transistor, a first terminal of the tenth transistor being connected to the first read-write control circuit and the second read-write control circuit, a second terminal of the tenth transistor being configured to receive the second signal, and a control terminal of the tenth transistor being configured to receive the preset enable signal.

8. The local sensing amplifier according to claim 4, wherein the second signal is a low-level signal, and the first signal is a high-level signal.

9. The local sensing amplifier according to claim 1, wherein the local sensing amplifier is further connected to a read control signal line and a write control signal line, the read control signal line being configured to transmit the read control signal, the write control signal line being configured to transmit the write control signal, the local sensing amplifier further comprising:
a read control circuit connected to the global signal line, the complementary local signal line and the read control signal line, the read control circuit being configured to output a second signal to the global signal line when the complementary local signal line transmits a first signal and the read control signal is in an enabled state;
a first write control circuit connected to the global signal line, the local signal line and the write control signal line, the first write control circuit being configured to transmit the signal on the global signal line to the local signal line when the write control signal is in an enabled state; and
a second write control circuit connected to the global signal line, the complementary local signal line and the write control signal line, the second write control circuit being configured to output the second signal to the complementary local signal line when the write control signal is in an enabled state and the global signal line transmits the first signal.

10. The local sensing amplifier according to claim 9, further comprising:
an auxiliary read-write circuit connected to the first write control circuit, the local signal line and the complementary local signal line, the auxiliary read-write circuit being configured to output the first signal to the complementary local signal line when the write control signal is in the enabled state and the global signal line transmits the second signal;
wherein the auxiliary read-write circuit is further configured to amplify a signal transmitted by the local signal line and a signal transmitted by the complementary local signal line when the read control signal is in the enabled state.

11. The local sensing amplifier according to claim 10, wherein the auxiliary read-write circuit comprises:
a second signal auxiliary circuit configured to receive the second signal, controlled by a preset enable signal, the second signal auxiliary circuit being configured to transmit the second signal to the complementary local signal line when the preset enable signal is in an enabled state and a voltage transmitted by the local signal line is greater than a voltage transmitted by the complementary local signal line, and to transmit the second signal to the local signal line when the preset enable signal is in the enabled state and the voltage transmitted by the local signal line is smaller than the voltage transmitted by the complementary local signal line.

12. The local sensing amplifier according to claim 10, wherein the auxiliary read-write circuit is further connected to the preset voltage source, the preset voltage source being configured to provide the first voltage when the read control signal is in the enabled state, the auxiliary read-write circuit being further configured to output the first signal to the local signal line when a voltage transmitted by the local signal line is greater than a voltage transmitted by the complementary local signal line, and to output the first signal to the complementary local signal line when the voltage transmitted by the local signal line is smaller than the voltage transmitted by the complementary local signal line, and the first signal being equal to the first voltage.

13. The local sensing amplifier according to claim 9, wherein:
the read control circuit comprises a fourth transistor, a first terminal of the fourth transistor being connected to the local signal line, a second terminal of the fourth transistor being connected to the global signal line, and a control terminal of the fourth transistor being connected to the write control signal line;
the first write control circuit comprises: a fifth transistor, a first terminal of the fifth transistor being connected to the global signal line, and a control terminal of the fifth transistor being connected to the complementary local signal line; and a sixth transistor, a first terminal of the sixth transistor being connected to a second terminal of the fifth transistor, a second terminal of the sixth transistor being configured to receive the second signal, and a control terminal of the sixth transistor being connected to the read control signal line; and the second write control circuit comprises: an eleventh transistor, a first terminal of the eleventh transistor being connected to the complementary local signal line, and a control terminal of the eleventh transistor being connected to the global signal line; and a twelfth transistor, a first terminal of the twelfth transistor being connected to a second terminal of the eleventh transistor, a second terminal of the twelfth transistor being configured to receive the second signal, and a control terminal of the twelfth transistor being connected to the write control signal line.

14. The local sensing amplifier according to claim 10, wherein the auxiliary read-write circuit comprises:
a thirteenth transistor, a first terminal of the thirteenth transistor being connected to the preset voltage source, a second terminal of the thirteenth transistor being connected to the complementary local signal line, and a control terminal of the thirteenth transistor being connected to the local signal line;
a fourteenth transistor, a first terminal of the fourteenth transistor being connected to the preset voltage source, a second terminal of the fourteenth transistor being connected to the local signal line, and a control terminal of the fourteenth transistor being connected to the complementary local signal line;
a fifteenth transistor, a first terminal of the fifteenth transistor being connected to the local signal line, a second terminal of the fifteenth transistor being configured to receive the second signal, and a control terminal of the fifteenth transistor being connected to the complementary local signal line; and
a sixteenth transistor, a first terminal of the sixteenth transistor being connected to the complementary local signal line, a second terminal of the sixteenth transistor being configured to receive the second signal, and a control terminal of the sixteenth transistor being connected to the local signal line.

15. The local sensing amplifier according to claim 11, wherein the second signal auxiliary circuit comprises:
a seventeenth transistor, a first terminal of the seventeenth transistor being connected to the second terminal of the fifteenth transistor and the second terminal of the sixteenth transistor, a second terminal of the seventeenth transistor being configured to receive the second signal, and a control terminal of the seventeenth transistor being configured to receive the preset enable signal, the second signal auxiliary circuit being configured to output the second signal to the fifteenth transistor and the sixteenth transistor when the preset enable signal is in the enabled state.

16. The local sensing amplifier according to claim 1, wherein the preset voltage source is simultaneously connected to a plurality of local sensing amplifiers.

17. The local sensing amplifier according to claim 1, wherein the precharge circuit is arranged in the sense amplifier array.

18. A memory, comprising:
a plurality of memory arrays, a sense amplifier array being arranged between adjacent two of the plurality of memory arrays, and each of the sense amplifier arrays being connected to adjacent two of the plurality of memory arrays;
a local sensing amplifier, the local sensing amplifier being connected to a global signal line, and being connected to the sense amplifier array by means of a local signal line and a complementary local signal line; and
a row decoding and control circuit provided with a preset voltage source, the preset voltage source being configured to output a first voltage and a second voltage to the local sensing amplifier;
wherein the local sensing amplifier is configured to transmit a signal on the local signal line to the global signal line when a read control signal is received, and to transmit a signal on the global signal line to the local signal line when a write control signal is received;
wherein the local sensing amplifier comprises:
a precharge circuit connected to a preset voltage source, the local signal line and the complementary local signal line, the preset voltage source being configured to provide a first voltage in a read-write interval and provide a second voltage in an idle period, the precharge circuit being configured to transmit the first voltage to the local signal line and the complementary local signal line in the read-write interval, and to transmit the second voltage to the local signal line and the complementary local signal line in the idle period; wherein the second voltage is smaller than the first voltage; and,
wherein the preset voltage source is arranged in a row decoding and control circuit, the preset voltage source comprising:
a first switch element, a first terminal of the first switch element being connected to the first voltage, a second terminal of the first switch element being connected to an output terminal of the preset voltage source, and a control terminal of the first switch element being connected to a first voltage output control signal;
a second switch element, a first terminal of the second switch element being connected to the second voltage, a second terminal of the second switch element being connected to the output terminal of the preset voltage source, and a control terminal of the second switch element being connected to a second voltage output control signal; and
a voltage switching subcircuit connected to the first switch element and the second switch element, the voltage switching subcircuit being configured to output the first voltage output control signal in the read-write interval, and output the second voltage output control signal in the idle period.

19. The memory according to claim 18, wherein the local sensing amplifier is further connected to a complementary global signal line, a read control signal line and a write control signal line, the read control signal line being configured to transmit the read control signal, the write control signal line being configured to transmit the write control signal, the local sensing amplifier further comprising:
a first read-write control circuit connected to the local signal line, the complementary local signal line, the global signal line, the read control signal line and the write control signal line, the first read-write control circuit being configured to transmit the signal on the global signal line to the local signal line when the write control signal is in an enabled state, and output a second signal to the global signal line when the read control signal is in the enabled state and the complementary local signal line transmits a first signal, the second signal being inverse in phase to the first signal; and a second read-write control circuit connected to the local signal line, the complementary local signal line, the complementary global signal line, the read control signal line and the write control signal line, the second read-write control circuit being configured to transmit a signal on the complementary global signal line to the complementary local signal line when the write control signal is in an enabled state, and output the second signal to the complementary global signal line when the read control signal is in the enabled state and the local signal line transmits the first signal.

20. The memory according to claim 18, wherein the local sensing amplifier is further connected to a read control signal line and a write control signal line, the read control signal line being configured to transmit the read control signal, the write control signal line being configured to transmit the write control signal, the local sensing amplifier further comprising:

a read control circuit connected to the global signal line, the complementary local signal line and the read control signal line, the read control circuit being configured to output a second signal to the global signal line when the complementary local signal line transmits a first signal and the read control signal is in an enabled state;

a first write control circuit connected to the global signal line, the local signal line and the write control signal line, the first write control circuit being configured to transmit the signal on the global signal line to the local signal line when the write control signal is in an enabled state; and a second write control circuit connected to the global signal line, the complementary local signal line and the write control signal line, the second write control circuit being configured to output the second signal to the complementary local signal line when the write control signal is in an enabled state and the global signal line transmits the first signal.

\* \* \* \* \*